United States Patent [19]

Straus

[11] 4,344,173

[45] Aug. 10, 1982

[54] STABILIZATION CIRCUIT FOR A DIGITALLY OPERATED LASER

[75] Inventor: Joseph Straus, Ottawa, Canada

[73] Assignee: Northern Telecom Limited, Montreal, Canada

[21] Appl. No.: 182,098

[22] Filed: Aug. 28, 1980

Related U.S. Application Data

[63] Continuation-in-part of Ser. No. 945,326, Sep. 25, 1978.

[51] Int. Cl.³ .............................................. H01S 3/13
[52] U.S. Cl. ......................................... 372/38; 372/29
[58] Field of Search .................... 331/94.5 S; 307/312; 250/199

[56] References Cited

U.S. PATENT DOCUMENTS

| | | | |
|---|---|---|---|
| 3,258,596 | 6/1966 | Green | 307/312 |
| 4,009,385 | 2/1977 | Sell | 250/199 |
| 4,101,847 | 7/1978 | Albaness | 307/312 |

OTHER PUBLICATIONS

"Laser Frequency Stabilization: Combined Integrating Thermal-Proportional Servos", Clark; Applied Optics, vol. 15, No. 6, Jun. 1976.

Primary Examiner—William L. Sikes
Assistant Examiner—Léon Scott, Jr.
Attorney, Agent, or Firm—Stuart L. Wilkinson

[57] ABSTRACT

Compensation for variation of a semiconductor laser threshold position is based on the utilization of the rectifying property of such lasers near threshold. A small amplitude test signal is applied to the laser close to threshold and a distortion component at a harmonic of the test signal frequency is isolated from a voltage or current analog generated from the laser light output. Depending on the order of the harmonic, the characteristic of this distortion component has a maximum value (even harmonic) or is zero valued (odd harmonic) when the threshold current is applied to the laser. If the laser threshold position changes, a feedback circuit resets the bias current applied to the laser to a value close to but just below, the threshold position. The test signal can also be used to compensate for change in laser slope efficiency to avoid any variation in signal power output at a fixed modulation level.

13 Claims, 4 Drawing Figures

STABILIZATION CIRCUIT FOR A DIGITALLY OPERATED LASER

This application is a continuation-in-part application of application Ser. No. 945,326 filed Sept. 25, 1978.

This invention relates to a method and apparatus for stabilizing digital operation of a semiconductor injection laser so as to compensate for variation of laser threshold position and slope efficiency caused by temperature change, laser aging and other degrading phenomena.

Semiconductor lasers for use in fiber optic communication systems have a light output/applied current characteristic in which, above a threshold current, the device lases and below which only spontaneous emission occurs. For digital systems such lasers are operated by continuously applying to the laser a DC bias to a level just below the threshold current so that the laser is maintained in the spontaneous emission zone. A modulating current of digital character representative of a signal to be transmitted is then applied to the laser so that each digital pulse drives the laser into its lasing mode.

It is important that the DC bias current be altered to track the threshold position as the threshold position changes with age and temperature. If it is not, a change in threshold position causes the laser output to vary for fixed modulating current. Moreover, turn-on delay, that is, the period between application of a digital pulse and onset of lasing, can also vary leading to an increase in intersymbol interference in a digital system.

Several possible bias stabilization techniques may be found in an article by R. E. Epworth, entitled "Subsystems For High Speed Optical Links", Proceedings of the Second European Conference on Optical Fibre Communication, pp 377–382, Paris, France, 1976. In the earlier techniques, laser light output level is monitored and compared to a preset reference level to provide an error signal for subsequent generation of a feedback signal. A disadvantage of some of the more feasible biasing schemes is that they require wire bandwidth components in the feedback path.

An alternative compensation method is described by A. Albanese in an article entitled "Automatic Bias Control (ABC) for Injection Lasers", Digest of Technical Papers at Topical Meeting 1977, Williamsburg, Va. The method is based on voltage saturation principles of lasers at threshold. An advantage of the automatic biasing circuit described is that it does not require optical detection to stabilize the laser bias. In practice, it is considered that a loss of voltage saturation can occur in lasers with aging or degradation. A partial loss of saturation always occurs in non-ideal devices. These facts to a certain degree then limit the dynamic range of the compensation method described.

A technique is now proposed based on the capacity of semiconductor lasers when biased near threshold to partially rectify a small sinusoidal test signal.

According to one aspect of the invention, there is provided a method of operating a semiconductor laser for digital transmission, the method comprising: directing a d.c. bias current through the laser; directing through said laser a sinusoidal test signal of a predetermined frequency; monitoring light emitted from the laser in response to the bias current and said test signal; generating an electrical analog of such emitted light; directing the electrical analog through a filter network adapted to pass a predetermined odd harmonic distortion component of said test signal; using an analyzing network, analyzing the output of said filter network to determine a threshold current at which the filter output is zero; and using a feedback loop, feeding an output from the analyzing network to a bias current generating means thereby to set the bias current to a value close to and below said threshold current.

The third order harmonic distortion component of the electrical analog is preferably used since its amplitude is greater than the higher odd harmonic distortion components and so gives a larger dynamic range for detection. Low order even harmonic distortion components, e.g. second harmonic, can be used instead of an odd harmonic distortion component, but in this case, an analyzing network is used to determine a threshold current at which the filter output is a maximum.

According to another aspect of the invention a pulsed test signal having a predetermined repetition frequency can be used. In this case, the amplitude of the selected harmonic will include an additional component from the original pulse frequency spectrum. Accordingly instead of detecting a zero in the filter output of an odd harmonic distortion component, a minimum value is detected.

Operation of a semiconductor laser can be stabilized simultaneously with its use for a digital transmission by having pulses in an applied digital modulating signal operate a switch to inhibit application of the test signal to the laser while pulses of the digital signal are being applied to the laser. Alternatively at the expense of some loss in dynamic range of the digital modulating signal, the test signal can be applied continuously.

As well as maintaining a d.c. bias reference position, the test signal can also be used to compensate for laser slope efficiency variation. To achieve this, the electrical analog of the emitted light is filtered to exclude the modulating signal, a d.c. level representative of the power in the filter passband is generated, the d.c. level is compared to a reference d.c. level, and a difference signal is generated and used to alter the amplitude of the digital modulating signal applied to the laser.

According to another aspect of the invention, there is provided apparatus for operating an injection laser for digital transmission, the apparatus comprising: means for applying d.c. bias current to the laser; means for modulating current through said laser with a test signal at a predetermined frequency; detector means for providing an electrical analog from a light output from the laser; a filter network for passing a predetermined harmonic distortion component of said test signal; analyzing means for determining a threshold bias current at which an output from the filter network is a critical value such as a maximum, a minimum, ON is zero valued; and feedback means under the control of said analyzing means for automatically adjusting bias current applied to the laser to a value close to and below said threshold current.

Embodiment of the invention will now be described by way of example with reference to the accompanying drawings in which.

Figure 1:
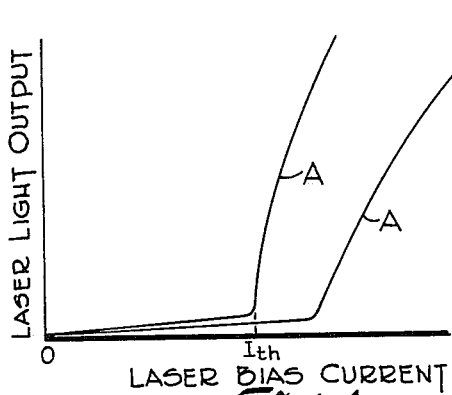
FIG. 1 is a graphical representation of the lasing light output/applied current characteristic of a semiconductor injection laser showing the effects of temperature variation and laser aging.

Referring in detail to FIG. 1, there are illustrated combined effects of aging and temperature variation on the light output/applied current characteristic of a semiconductor injection laser.

A temperature variation, especially, changes the threshold current which must be applied before the device lases, while the lasing efficiency of the device, which is measured by the slope of zones A of the graphical plot, is reduced by aging.

As explained previously, variation in threshold position is undesirable since, for a fixed d.c. bias current, the turn-on delay is increased. Thus part of a digital pulse in an applied modulating signal is wasted in bringing the device to the threshold position before onset of lasing to transmit intelligence in the modulated signal. More importantly, the resulting optical pulse peak level is decreased. In addition, decrease in slope efficiency is undesirable since it produces a decrease peak output level in response to a pulsed input having a fixed amplitude.

An electrical circuit for compensating for laser degradation is shown schematically in FIG. 4 but before the circuit is described, an outline of the theory underlying the invention will be given.

It can be shown that, neglecting the contribution of spontaneous emission to light output and considering the idealized case of a laser having a linear response either side of a threshold position, the light output/applied current characteristic of the laser can be written as:

$$L = \mu(I - I_{th}) \quad I > I_{th}$$

$$L = 0 \quad I < I_{th}$$

where $\mu$ denotes the slope efficiency, L is the light output, I is the applied current and $I_{th}$ is the applied current at lasing threshold.

The central idea behind the d.c. bias stabilization scheme of the invention is that if a small sinusoidal test signal is applied to a laser which is biased at the threshold position, the test signal will be partially rectified. In turn, certain harmonic distortion components derived from the laser output will be zero valued or show maxima when the laser is biased at the threshold position. These critical points can then serve as reference points for tracking the laser threshold position. In particular, when the laser is biased at the threshold position, the amplitude of the second harmonic distortion component in the laser output is a maximum whereas the amplitude of the third harmonic distortion component is equal to zero. In general, the light content of the odd harmonics is equal to zero while that of even harmonics is a maximum at $I_{th}$.

Figure 2:
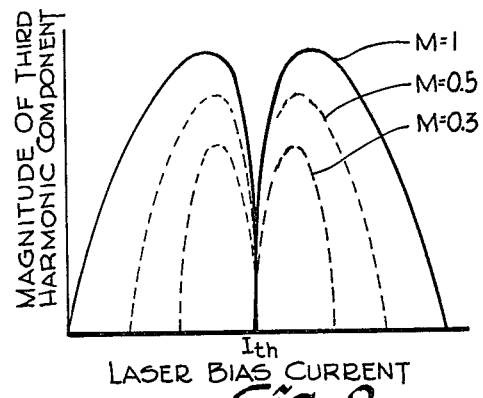
FIG. 2 shows graphically the manner in which the magnitude of the third harmonic distortion component of a test signal applied to the laser depends on current applied to the laser and on the test signal modulation level.
Figure 3:
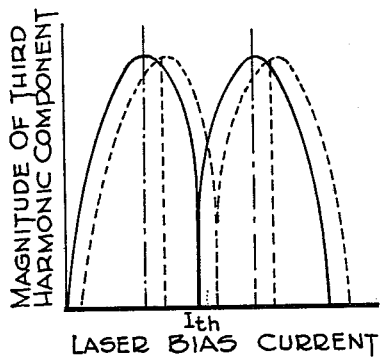
FIG. 3 shows graphically the manner in which the magnitude of the third harmonic distortion component of a test signal applied to the laser depends on the current applied to the laser and on degrading phenomena such as temperature change.
Figure 5:
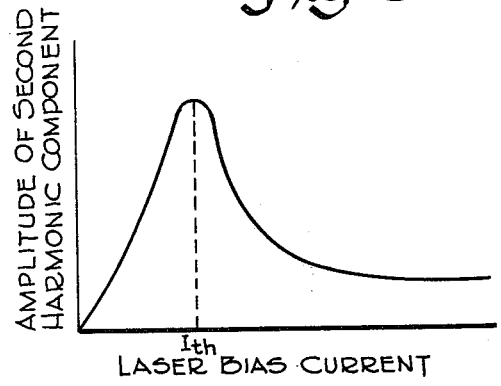
FIG. 5 shows graphically the manner in which the magnitude of the second harmonic distortion component of a test signal applied to the laser varies with applied current.

The magnitude of the third harmonic distortion component of the test signal is illustrated in FIGS. 2 and 3 while that of the second harmonic is illustrated in FIG. 5, the magnitude in each case being shown as a function of current applied to the laser. As illustrated in FIG. 2, a zero value minimum occurs when the laser is d.c. biased at threshold. The magnitude of the third harmonic is also characterized by maxima but these points depend on the modulation level amplitude $m = I_p/I_{th}$.

The result of the change in the threshold position on the magnitude of the third harmonic distortion component at a fixed test signal level is shown in FIG. 3. The threshold current, which corresponds to the third harmonic zero value, has shifted to the right. To compensate for this the d.c. bias, which is initially set just below the original threshold current, must also be shifted. This is done by the feedback circuit of FIG. 4.

The test signal can also be used to compensate for changes in laser slope efficiency since the light output power of the laser produced in response to the test signal is proportional to the laser slope efficiency.

Figure 4:
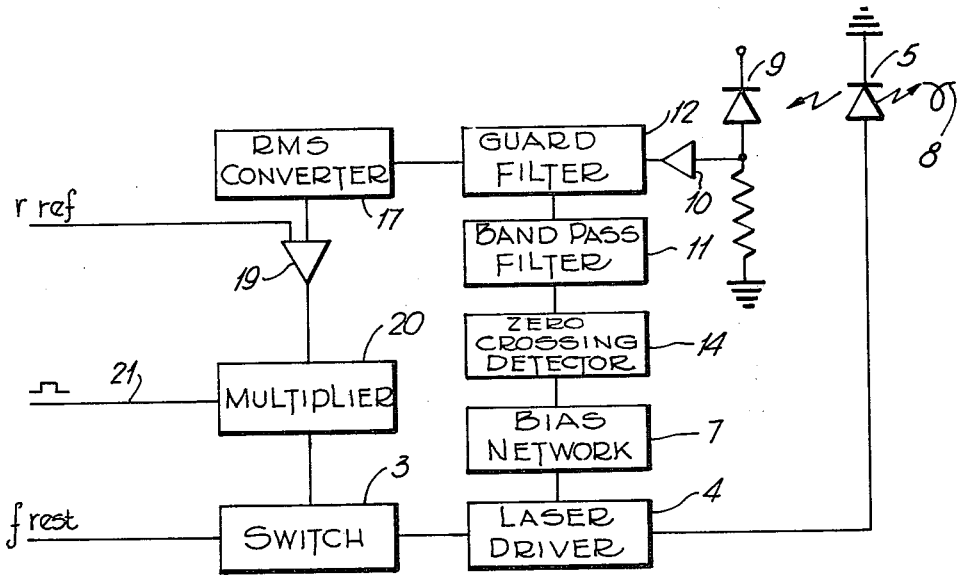
FIG. 4 is a block schematic diagram of apparatus for stabilizing the output of a digitally operated semiconductor injection laser.

Referring in detail to FIG. 4, the circuit shows a semiconductor injection laser 5 from one facet of which light is directed into an optical fibre 8 and from the reverse facet of which light is directed to a photodiode 9. A pulsed digital modulating signal 21, a low amplitude, low frequency sinusoidal test signal $f_{test}$ of for example 800 Hz, and a d.c. bias from a bias network 7 are applied to the laser 5 through a laser driver network 4. The d.c. bias is applied continuously and the test signal is applied only during periods that there is no pulse in the digital signal 21. The test signal and the modulating signal are switched at a switching network 3, the switched signal being combined with the d.c. bias at the laser driver network 4.

The light output from laser 5 produces an electrical analog at the photodiode 9, this being amplified at amplifier 10. The output from the amplifier is taken through a guard filter 12 so as to exclude frequencies associated with the modulating signal. One output from the filter is used to compensate for any changes in laser threshold position by altering the applied d.c. bias current to maintain it close to but below the threshold current. Another output is used to change the modulation level of the modulating signal to compensate for changes in laser slope efficiency.

The first output is directed through a bandpass filter network 11 centered at 2.4 KHz, so that a third harmonic distortion component of the test signal is passed. The output of the filter network is taken to a zero crossing detector 14.

If a non-zero output is detected, an output from the zero crossing detector is fed to the bias current generating network 7 to alter the d.c. bias current to a value at which a zero level is detected in the filter output.

As may be appreciated from the FIGS. 2 and 3 graphical representations, the magnitude of the third harmonic distortion component is a minimum threshold. In an alternative embodiment (not shown) a minimum level detector or a slope detector can be used to detect a minimum in the modulus of the third harmonic distortion component.

In the bias current generating network 7, the d.c. bias is set at a value a few mA, below the threshold current since, as mentioned previously, this is the optimum condition for digital operation.

It should be noted that the gating at gate 3 is equivalent to test signal sampling. Following sampling theory, the original frequency spectrum of the sample test signal can be recovered by filtering providing the sampling frequency is greater than twice the information bandwidth. In practice, such a recovery, in the case of a test signal can be assured since the bit rate of digital data transmission should be considerably higher than the frequency of the test signal and its harmonic of interest. The penalty for the biased stabilization scheme described is an increased transmitter circuit complexity as well as a slightly reduced detection margin between ONES and ZEROS. Assuming a 200 mA peak drive pulse for the digital modulating signal and a test signal of a maximum 5 mA p-p amplitude, the reduction in the detection margin in a worst case situation is equal to 1.25%. The switch 3 can however be replaced by an adder and the test signal impressed continuously throughout digital operation, the expense being a deterioration in detection margin to about 2.5%.

Although the embodiment specifically described has been in terms of using a sinusoidal test signal, a pulsed test signal can also be used. Thus a pulsed signal at a pulse repetition frequency of, say, 800 Hz has harmonics at 1.6 KHz, 2.4 KHz ... etc. If the pulsed test signal is applied to a laser, the laser output will include a fundamental component at 2.4 KHz together with a third harmonic component at 2.4 KHz. Analysis of the third harmonic distortion component will reveal a non-zero minimum at the threshold position. This enables the threshold current to be tracked using a pulsed test signal.

For simultaneously compensating for changes in laser slope efficiency, a second output from the filter 12 is rectified in a RMS converter 17 and compared with a preset reference level at a comparator 19. An output from the comparator forms an input to a multiplier 20 at which the peak amplitude of the digital modulating signal is set. Thus, in response to variation of the laser slope efficiency shown in FIG. 1, the modulation level is altered to maintain the laser light output uniform for a fixed amplitude modulating signal.

As mentioned previously even harmonic distortion components, e.g. the second harmonic can be used to track the threshold level. In this case a peak level detector is used in place of the zero crossing detector.

What is claimed is:

1. A method of operating an injection laser for digital transmission, the method comprising:
   directing a d.c. bias current through the laser;
   directing through said laser a low amplitude electrical test signal having a fundamental frequency, wherein said test signal is pulsed at a predetermined pulse repetition frequency;
   monitoring light emitted from the laser in response to the bias current and said test signal;
   generating an electrical analog of such monitored light;
   directing the electrical analog through a filter network for passing a predetermined harmonic distortion component of said test signal;
   analyzing the filter output at an analyzing network to determine a magnitude of d.c. bias current at which variation of the predetermined harmonic distortion component magnitude reaches a point corresponding to the lasing threshold current, said point being either a maximum value or a minimum value, depending on whether said predetermined harmonic distortion component is even or odd, respectively; and
   using a feedback loop, feeding an output from the analyzing network to a bias current generating means thereby to set the d.c. bias current applied to the laser to a value close to and below said threshold current.

2. A method of operating an injection laser for digital transmission, the method comprising:
   directing a d.c. bias current through the laser;
   directing through said laser a low amplitude, electrical, sinusoidal test signal having a fundamental frequency;
   monitoring light emitted from the laser in response to the bias current and said test signal;
   generating an electrical analog of such monitored light;
   directing the electrical analog through a filter network for passing a third harmonic distortion component of said test signal;
   analyzing the filter output at an analyzing network to determine a magnitude of d.c. bias current at which variation of the third harmonic distortion component magnitude reaches a point of substantially zero value, said point corresponding to the lasing threshold current; and
   using a feedback loop, feeding an output from the analyzing network to a bias current generating means thereby to set the d.c. bias current applied to the laser to a value close to and below said threshold current.

3. A method of operating an injection laser for digital transmission, the method comprising:
   directing a d.c. bias current through the laser;
   directing through said laser a low amplitude, electrical, sinusoidal test signal having a fundamental frequency;
   monitoring light emitted from the laser in response to the bias current and said test signal;
   generating an electrical analog of such monitored light;
   directing the electrical analog through a filter network for passing the second harmonic distortion component of said test signal;
   analyzing the filter output at an analyzing network to determine a magnitude of d.c. bias current at which variation of the second harmonic distortion component magnitude reaches a point of maximum value, said point corresponding to the lasing threshold current; and
   using a feedback loop, feeding an output from the analyzing network to a bias current generating means thereby to set the d.c. bias current applied to the laser to a value close to and below said threshold current.

4. A method as claimed in claim 1, in which the filter network passes a harmonic distortion component at three times the pulse repetition frequency of the pulsed test signal and the filter output is analyzed to determine a magnitude of d.c. bias current at which variation of the harmonic distortion component magnitude reaches a point of minimum value.

5. A method as claimed in claim 1, in which the filter network passes a harmonic distortion component at twice the pulse repetition frequency of the pulsed test signal and the filter output is analyzed to determine a magnitude of d.c. bias current at which variation of the harmonic distortion component magnitude passes through a point of maximum value.

6. A method of operating an injection laser for digital transmission, the method comprising:

directing a d.c. bias current through the laser;

directing through said laser a low amplitude electrical test signal having a fundamental frequency;

monitoring light emitted from the laser in response to the bias current and said test signal;

generating an electrical analog of such monitored light;

directing the electrical analog through a filter network for passing a predetermined harmonic distortion component of said test signal;

analyzing the filter output at an analyzing network to determine a magnitude of d.c. bias current at which variation of the predetermined harmonic distortion component magnitude reaches a point corresponding to the lasing threshold current, said point being either a maximum value or a minimum value, depending on whether said predetermined harmonic distortion component is even or odd, respectively;

using a feedback loop, feeding an output from the analyzing network to a bias current generating means thereby to set the d.c. bias current applied to the laser to a value close to and below said threshold current; and wherein a pulsed digital modulating data signal is also applied to the laser, the electrical analog is passed through a filter network having a passband excluding a component of the electrical analog resulting from the data signal, a d.c. level representative of the power in the passband is generated and compared with a d.c. reference level, and a corresponding difference signal is generated and is used to vary a peak amplitude level of the digital modulating data signal thereby to compensate for variation in the laser slope efficiency.

7. Apparatus for operating a semiconductor injection laser for digital transmission, the apparatus comprising:

means for applying a d.c. bias current to the laser;

means for modulating current through said laser with an electrical test signal at a predetermined frequency;

light detector means for providing an electrical analog from a light output from the laser;

a filter network with an output for passing a third harmonic distortion component of said test signal;

analyzing means for analyzing the filter output to determine a magnitude of d.c. bias current at which variation of the third harmonic distortion component magnitude reaches a point of minimum value corresponding to the lasing threshold current; and feedback means under the control of said analyzing means for automatically adjusting the d.c. bias current applied to the laser to a value close to and less than said threshold current.

8. Apparatus for operating a semiconductor injection laser for digital transmission, the apparatus comprising:

means for applying a d.c. bias current to the laser;

means for modulating current through said laser with an electrical test signal at a predetermined frequency;

light detector means for providing electrical analog from a light output from the laser;

a filter network with an output for passing from said electrical analog a predetermined harmonic distortion component of said test signal;

analyzing means for analyzing the filter output to determine a magnitude of d.c. bias current at which variation of the predetermined harmonic distortion component amplitude reaches a point of substantially zero value corresponding to the lasing threshold current, said analyzing means including a zero crossing detector for detecting said point of zero value in the amplitude of the predetermined harmonic distortion component; and feedback means under the control of said analyzing means for automatically adjusting the d.c. bias current applied to the laser to a value close to and less than said threshold current.

9. Apparatus for operating a semiconductor injection laser for digital transmission, the apparatus comprising:

means for applying a d.c. bias current to the laser;

means for modulating current through said laser with an electrical test signal at a predetermined frequency;

light detector means for providing an electrical analog from a light output from the laser;

a filter network with an output for passing from said electrical analog a predetermined harmonic distortion component of said test signal;

analyzing means for analyzing the filter output to determine a magnitude of d.c. bias current at which variation of the predetermined harmonic distortion component magnitude reaches a point corresponding to the lasing threshold current, said point being either a maximum value or a minimum value depending on whether said predetermined harmonic distortion component is even or odd, respectively, and said analyzing means including a slope detector for detecting a marked slope change in the magnitude of the filter output; and feedback means under the control of said analyzing means for automatically adjusting the d.c. bias current applied to the laser to a value close to or less than said threshold current.

10. Apparatus for operating a semiconductor injection laser for digital transmission, the apparatus comprising:

means for applying d.c. bias current to the laser;

means for modulating current through said laser with an electrical test signal at a predetermined frequency;

light detector means for providing an electrical analog from a light output from the laser;

a filter network with an output for passing from said electrical analog a second harmonic distortion component of said test signal;

analyzing means for analyzing the filter output to determine a magnitude for d.c. bias current at which variation of the second harmonic distortion component amplitude reaches a point of maximum value corresponding to the lasing threshold current, said analyzing means including a peak level detector for detecting said maximum in the amplitude of the second harmonic distortion component; and feedback means under the control of said analyzing means for automatically adjusting the d.c. bias current applied to the laser to a value close to and less than said threshold current.

11. Apparatus as claimed in claim 10 in which the level detector includes a differentiator and a zero crossing detector.

12. Apparatus for operating a semiconductor injection laser for digital transmission, the apparatus comprising:

means for applying a d.c. bias current to the laser;

means for modulating current through said laser with an electrical test signal at a predetermined frequency;

light detector means for providing an electrical analog from a light output from the laser;

a filter network with an output for passing from said electrical analog a predetermined harmonic distortion component of said test signal;

analyzing means for analyzing the filter output to determine a magnitude of d.c. bias current at which variation of the predetermined harmonic distortion component magnitude reaches a point corresponding to the lasing threshold current, said point being either a maximum value or a minimum value depending on whether said predetermined harmonic distortion component is even or odd, respectively;

feedback means under the control of said analyzing means for automatically adjusting the d.c. bias current applied to the laser to a value close to and less than said threshold current;

means for applying a pulsed digital modulating signal to the laser;

a low pass filter for receiving an output from the light detector means;

means for generating a difference signal representative of the difference between the power level of the low pass filter output and a predetermined power level; and means for applying the difference signal to a control means for applying said pulsed digital data modulating signal to the laser thereby to adjust the modulation of the digital modulating signal to compensate for a change in the laser slope efficiency.

13. Apparatus for operating a semiconductor injection laser for digital transmission, the apparatus comprising:

means for applying d.c. bias current to the laser;

means for modulating current through said laser with an electrical test signal at a predetermined frequency;

light detector means for providing an electrical analog from a light output from the laser;

a filter network with an output for passing from said electrical analog a predetermined harmonic distortion component for said test signal;

analyzing means for analyzing the filter output to determine a magnitude of d.c. bias current at which variation of the predetermined harmonic distortion component magnitude reaches a point of minimum value corresponding to the lasing threshold current, said analyzing means including a minimum level detector for detecting said minimum in the magnitude of said predetermined harmonic distortion component, wherein said level detector includes a differentiator and a zero crossing detector; and feedback means under the control of said analyzing means for automatically adjusting the d.c. bias current applied to the laser to a value close to and less than said threshold current.

* * * * *